United States Patent [19]

Fujimura et al.

[11] Patent Number: 4,789,427

[45] Date of Patent: Dec. 6, 1988

[54] METHOD FOR REMOVING RESIST FROM SEMICONDUCTOR DEVICE

[75] Inventors: Shuzo Fujimura, Tokyo; Yoshikazu Kato; Syouzi Mochizuki, both of Mizusawa, all of Japan

[73] Assignee: Fujitsu Limited, Kawasaki, Japan

[21] Appl. No.: 51,396

[22] Filed: May 19, 1987

[30] Foreign Application Priority Data

May 20, 1986 [JP] Japan ................................ 61-113602

[51] Int. Cl.$^4$ ..................... B44C 1/22; C03C 15/00; C03C 25/06
[52] U.S. Cl. ................................. 156/643; 156/646; 156/651; 156/655; 437/225
[58] Field of Search ............... 156/643, 646, 651, 655; 437/186, 191, 193, 225, 228; 357/59, 65, 71

[56] References Cited

U.S. PATENT DOCUMENTS

| | | | |
|---|---|---|---|
| 3,881,242 | 5/1975 | Nuttall et al. | 437/193 X |
| 3,920,483 | 11/1975 | Johnson, Jr. et al. | 148/1.5 |
| 4,028,155 | 6/1977 | Jacob | 156/643 |
| 4,279,671 | 7/1981 | Komatsu | 437/186 X |
| 4,477,310 | 10/1984 | Park et al. | 156/648 X |

FOREIGN PATENT DOCUMENTS

EPA0040081 11/1981 European Pat. Off. .

OTHER PUBLICATIONS

IBM Technical Disclosure Bulletin, vol. 22, No. 4, Sep. 1979, p. 1457, N.Y., U.S.; R. Bartholomew et al.: "Photoresist stripping with in situ silicon oxide cleanup", (last paragraph).

IBM Journal of Research and Development, vol. 26, No. 5, Sep. 1982, pp. 580–589, Armonk, N.Y., U.S.; A. Bergendahl et al.: "Optimization of plasma processing for silicon-gate FET manufacturing applications."

Solid-State Electronics, vol. 25, No. 9, Sep. 1982, pp. 859–863, Exeter, GB; U. Niggebrugge et al.: "Effect of reactive sputter etching of SiO$_2$ on the properties of subsequently formed MOS systems" (abstract, [p. 86]; conclusion).

European Search Report, Place: Berlin, Date of Completion: 0-09-1987; Examiner: Pretzel B. C.

Primary Examiner—William A. Powell
Attorney, Agent, or Firm—Staas & Halsey

[57] ABSTRACT

A method for removing a resist on a layer formed on a semiconductor substrate includes the steps of removing a portion of the resist by plasma processing and removing the remaining resist by a chemical process.

This method prevents the entry of heavy metal particles contained in the resist into the semiconductor substrate, so that a functional region formed in the semiconductor substrate is not contaminated by the heavy metal particles. As a result, destruction of the functional elements formed in the functional region is prevented, and thus the minority carrier generation lifetime in the device is not reduced.

5 Claims, 3 Drawing Sheets

PRIOR ART

METHOD FOR REMOVING RESIST FROM SEMICONDUCTOR DEVICE

BACKGROUND OF THE INVENTION

1. Field of the Invention

The present invention relates to a technique for removing a resist and, more particularly, to a method for removing a resist coated on a layer, e.g., an insulation layer, formed on a semiconductor substrate, and a semiconductor device formed by using that method.

The resist removal technique according to the present invention is used, for example, when a resist used as a mask in an etching process or an ion implantation process employed in the production of a semiconductor integrated circuit is removed prior to a subsequent process.

2. Description of the Related Art

Conventionally, the removal of a resist is usually implemented by a chemical process such as a wet process, a process using an "afterglow" of plasma, a process using ozone, and the like. For example, the wet process is carried out by using a solution of an acid, an alkali, an organic solvent, and the like, e.g., a commercially available resist removal solution.

However, it is known that a resist cannot be perfectly removed by the chemical process. For example, in the ion implantation process, a resist is carbonized. Also, the surface of the resist is damaged in the etching process using fluorine gas or fluoride. The carbonized or damaged portion formed during these processes is not perfectly removed, and remains even after the resist removal process.

In view of the above circumstances, the chemical removal method has been replaced by a dry process or an ashing method, e.g., a plasma removal method using gas having a high oxygen content. This plasma removal method includes the processes wherein a gas is brought to a plasma state by applying a high frequency electric field, and the like thereto, generating a multiple of charged particles, e.g., electrons, ions, and the like therefrom, and removing a resist by utilizing a chemical reaction between the generated particles and the constituent atoms or molecules of the resist. The plasma removal method completely removes the resist, because the charged particles in the plasma have sufficient energy to break the bonds between the constituent atoms or molecules of the resist.

The accuracy in fabrication of semiconductor devices, or miniaturization or degree of high integration of semiconductor devices has recently been required, and accompanying this requirement, the thickness of an insulation layer formed on a semiconductor substrate, e.g., a silicon dioxide layer ($SiO_2$ layer), has been reduced to less than 20 nm (200 Å).

However, during the production of a semiconductor device having such a thin $SiO_2$ layer formed on the surface thereof, the inventors removed a resist coated on the $SiO_2$ layer by the plasma removal method, and found the following problems arising therefrom.

It is known that the resist contains a small quantity of heavy metal atoms. For example, a commercially available positive type resist (OFPR-800 produced by Tokyo Ohka, Co., Ltd.) contained 360 ppb of iron (Fe), 190 ppb of lead (Pb), 20 ppb of copper (Cu), and the like.

It was found that such heavy metal atoms sometimes permeated through the silicon dioxide layer having a thickness of less than 20 nm (200 Å), during the plasma removal process, entered the semiconductor, e.g., silicon (Si) substrate, and remained within the semiconductor, resulting in the destruction of functional elements formed in the semiconductor. In particular, it was found that the minority carrier generation lifetime was reduced from 500–600 $\mu$sec to 100 $\mu$sec, depending upon the plasma condition such as plasma density, plasma temperature, gas pressure, and the like, the thickness of the silicon dioxide layer and the quality thereof, the substrate temperature, and the like.

It is also known that the resist further contains alkaline metal atoms of sodium (Na), potassium (K) and the like, together with the aforementioned heavy metal atoms, and that the alkaline metal atoms and the heavy metal atoms enter the semiconductor during the plasma removal process. In this case, it is possible to remove the alkaline metal atoms by a subsequent process, e.g., an Hcl gettering. However, the leavy metal atoms cannot be removed by any subsequent process.

Accordingly, it should be noted that this contamination in the semiconductor by alkaline metal atoms is not permanent but temporary, and accordingly, is essentially different from the contamination in the semiconductor caused by the aforementioned heavy metal atoms.

SUMMARY OF THE INVENTION

An object of the present invention is to provide a resist removal method which can prevent a destruction of the functional elements formed in a semiconductor substrate, thereby preventing a reduction of the minority carrier generation lifetime in the device.

Another object of the present invention is to provide a semiconductor device formed by using the resist removal method of the present invention.

According to one aspect of the present invention, there is provided a method for removing a resist on a semiconductor device, including the steps of: removing the resist on a layer formed on a semiconductor substrate having a functional region, in a direction of the thickness thereof by a predetermined thickness by applying plasma processing; and removing the remaining resist by applying a chemical process.

According to another aspect of the present invention, there is provided a semiconductor device including: a semiconductor substrate having a functional region; and a layer formed on the semiconductor substrate and having a predetermined thickness, the semiconductor device being formed by removing a resist on the layer formed on the functional region, by a predetermined thickness, by means of plasma processing and removing the remaining resist by a chemical process, so that the entry of heavy metal particles contained in the resist into the functional region is prevented.

BRIEF DESCRIPTION OF THE DRAWINGS

Other objects and features of the present invention will be described hereinafter in detail by way of a preferred embodiment with reference to the accompanying drawings, in which;

FIGS. 3a to 3e are views illustrating an example of the resist removal process according to the present invention, with relation to the device shown in FIG. 2a.

DESCRIPTION OF THE PREFERRED EMBODIMENTS

For a better understanding of the preferred embodiment, the problems in the prior art will now be explained with reference to FIGS. 1a to 1c, which illustrate the prior art process using a plasma removal method.

Figure 1A:
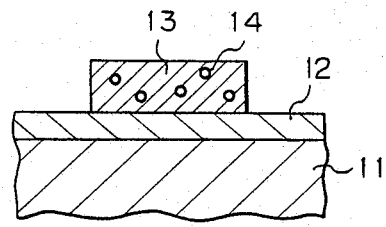
FIGS. 1a to 1c are views for explaining the problems in the prior art process using a plasma removal method.

FIG. 1a shows the state before removal, for example, after completion of the ion implantation process using a resist as a mask. In FIG. 1a, 11 denotes a silicon substrate, 12 an $SiO_2$ layer, 13 a resist, and 14 heavy metal atoms contained in the resist 13. In this case, the surface of the resist 13 may be carbonized or damaged during the ion implantation process. This carbonized or damaged portion is hereinafter referred to as quality-changed layer.

Figure 1B:
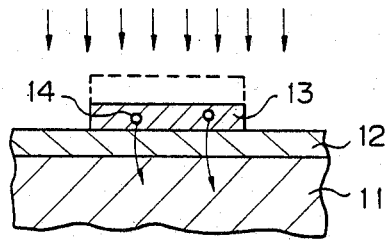

FIG. 1b shows the resist 13 being removed by plasma processing. In this case, although the above-mentioned quality-changed layer, if any, is completely removed, the heavy metal atoms 14 are forced to the bottom of the resist 13 by the collision of energetic species of the plasma, and some of the heavy metal atoms 14 are forced through the $SiO_2$ layer 12 and into the silicon substrate 11, as shown by arrow marks in FIG. 1b.

Figure 1C:
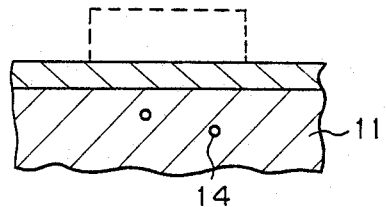

As a result, the heavy metal atoms 14 in the substrate 11 remain there even after the resist 13 is completely removed, as shown in FIG. 1c. The heavy metal atoms in the substrate 11 cannot be removed by any subsequent process, and accordingly, remain permanently in the substrate 11. Therefore, the heavy metal atoms form a contamination region within the semiconductor substrate 11, particularly in the vicinity of the ion implantation region where functional elements are formed. This results in a destruction of the elements and a reduction of the minority carrier generation lifetime in the device.

An embodiment of the present invention will now be described with reference to FIGS. 2a, 2b, and 3a to 3e.

Figure 2A:
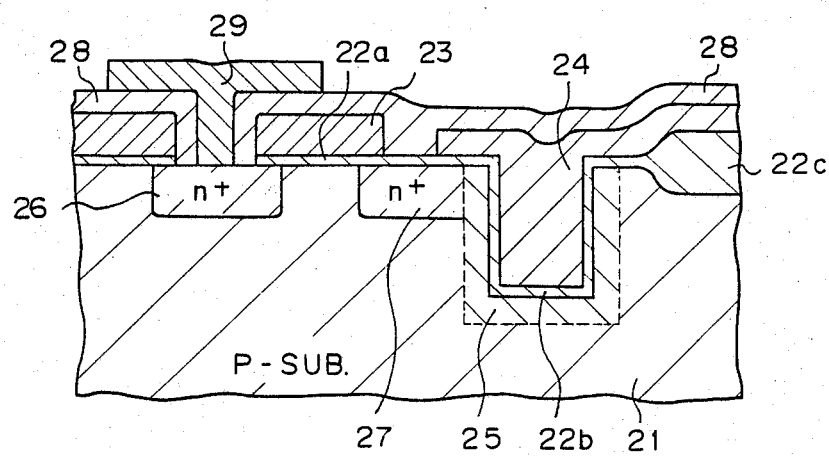
FIGS. 2a and 2b are a sectional view and an equivalent circuit diagram illustrating an example of the semiconductor device formed by applying the resist removal method according to the present invention.
Figure 2B:
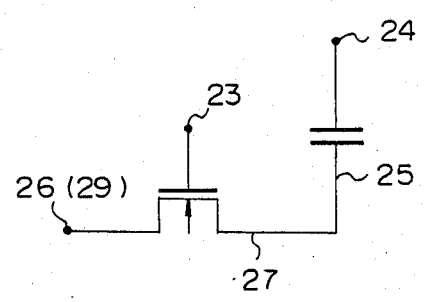

FIGS. 2a and 2b illustrate a sectional view and an equivalent circuit diagram, respectively, of an example of the semiconductor device formed by applying the resist removal method according to the present invention. The semiconductor device shown in FIG. 2a has a dynamic type random access memory (DRAM) cell structure. In FIG. 2a, reference numeral 21 denotes a p-type silicon substrate on which $SiO_2$ layers 22a, 22b, and 22c which function as a gate insulation layer, a dielectric layer, and a field insulation layer, respectively, are formed. Reference numeral 23 denotes a polysilicon layer functioning as a gate electrode; 24 a polysilicon layer functioning as a cell plate, i.e., a counter electrode; 25 an inversion layer functioning as an accumulating electrode; 26 and 27 high concentration n-type diffusion regions functioning as a source region and a drain region, having the depth of approximately 300 nm (3000Å), respectively; 28 $SiO_2$ layers for insulation between each layer; and 29 a polysilicon layer functioning as a bit line, having the thickness of approximately 400 nm (4000 Å). That is, as shown in FIG. 2b, a capacitor is constituted by the cell plate 24, the inversion layer 25, and the dielectric layer 22b, and a transistor is constituted by the gate electrode 23, the gate insulation layer 22a, and diffusion regions 26, 27.

FIGS. 3a to 3e illustrate an example of the resist removal process in the production of the device shown in FIG. 2a.

Figure 3A:
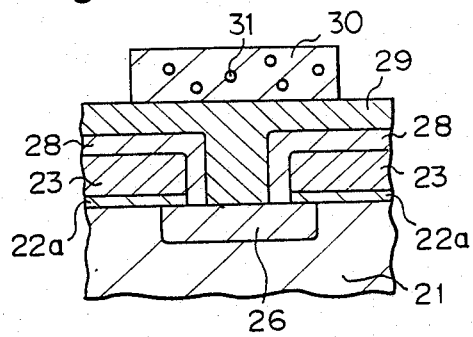

FIG. 3a shows the state before removal, wherein reference numeral 30 denotes a resist containing heavy metal atoms 31. This resist 30 is coated on a region of the polysilicon layer 29 formed over the $SiO_2$ layer 28 and diffusion region 26, corresponding to the position of the diffusion region 26. The resist 30 is coated so as to have the thickness two to three times as the implanted depth of ions.

Figure 3D:
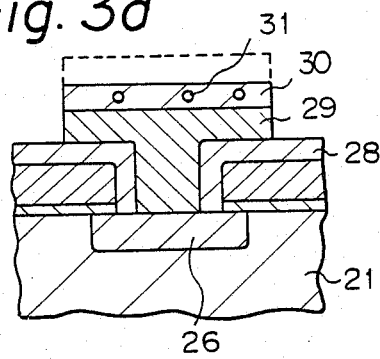
Figure 3B:
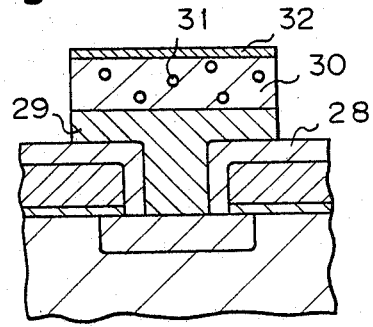

First, in the process of FIG. 3b, the polysilicon layer 29 is etched by using the resist 30 as a mask. In this case, a quality-changed layer 32 is formed on the surface of the resist 30. Next, in the process of FIG. 3c, removal of the resist 30 is started in plasma, using gas having a high oxygen content, in the direction of the thickness of the resist 30. In this case, if the quality-changed layer 32 and the whole resist 30 were removed by plasma processing, some of the heavy metal atoms 31 would enter the polysilicon layer 29, and furthermore, would enter the region 26 by thermal diffusion during thermal treatment, e.g., anneal process, to be carried out subsequently to the present resist removal process. This would cause the destruction of a functional element, i.e., a transistor.

However, the resist removal by the plasma is stopped when approximately half of the resist 30 has been removed, as shown in FIG. 3d. For example, the resist of approximately 500 nm (5000 Å) to 600 nm (6000 Å) is removed, under the ion implantation conditions that the dose amount of phosphorus (P) is $1 \times 10^{16}$ cm$^{-2}$ and the accelerated voltage is 70 keV. In this case, the quality-changed layer 32 and a portion of the resist 30 are completely removed because of the collision of energetic species of the plasma. Although the resist removal is carried out in plasma, the heavy metal atoms 31 such as Fe, Cu and the like do not enter the polysilicon layer 29, because the plasma removal process is stopped when approximately half of the thickness of the resist 30 has been removed. Accordingly, the plasma is not exerted on the heavy metal atoms 31 in the bottom of the resist 30, and thus the heavy metal atoms 31 are not forced into the polysilicon layer 29. As a result, the functional element, i.e., transistor, is not contaminated by the heavy metal atoms 31, and thus the destruction of the element is prevented, and the minority carrier generation lifetime in the device is not reduced.

Figure 3E:
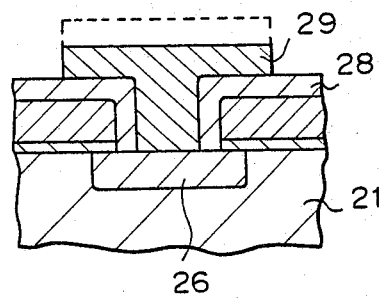
Figure 3C:
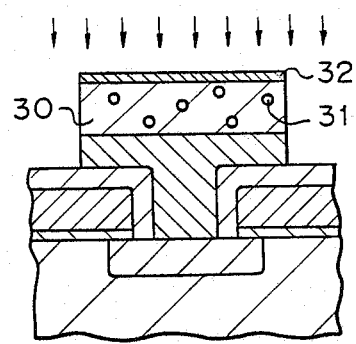

Finally, in the process of FIG. 3e, the remaining resist is removed by an "afterglow" or "down stream" effect of the plasma, in which an electrically neutral and chemically active gas which has been excited and a stable energy is used. In this case, the heavy metal atoms 31 in the remaining resist are not forced into the polysilicon layer 29, because energetic species of plasma do not substantially collide in the afterglow. Therefore, the diffusion region 26 and the silicon substrate 21 are not contaminated by the heavy metal atoms 31, and thus the destruction of the transistor having the diffusion region 26 as a constituent element is prevented, and the minority carrier generation lifetime in the device is not reduced.

We implemented the processes shown in FIGS. 3a to 3e under a variety of conditions. An example of the conditions is as follows: the temperature of the silicon substrate 21, 100° C.; the energy with which ions are accelerated in plasma, 100 eV; the excitation frequency, 13.56 MHz; and a reactive ion etching (RIE) using only oxygen gas. Under these conditions, the thickness of the resist 30 coated on the polysilicon layer 29 was approximately 1.3 μm. And, the thickness of the remaining resist after the removal by plasma was approximately 500 nm (5000 Å) In this case, we reduced the thickness of the remaining resist to approximately 100 nm (1000 Å) by plasma processing, and found that the heavy metal atoms 31 did not enter the polysilicon layer 29.

Although the resist removal method according to the present invention is described by way of an example with reference to FIGS. 3a to 3e in relation to the forming of the polysilicon layer 29, it also can be applied to the forming of the polysilicon layer 23 and the polysilicon layer 24. In this case, the polysilicon layers 23 and 24 are connected by the $SiO_2$ layers 22a, 22b, and 22c to the semiconductor region, i.e., the substrate 21, inversion layer 25, and diffusion regions 26 or 27, while the polysilicon layer 29 is directly connected to the semiconductor region, i.e., the diffusion region 26. Therefore, the possibility of the entry of heavy metal atoms contained in the resist into the semiconductor region is higher in the forming of the polysilicon layer 29 than that in the forming of the polysilicon layers 23 and 24. In practice, when forming the polysilicon layer 29, the present inventors carried out the resist removal according to the process shown in FIGS. 3a to 3e, and found that the semiconductor region was not contaminated by the heavy metal atoms and that the minority carrier generation lifetime in the device was not reduced.

Also, although the present inventors employed the afterglow method as a chemical process in the process of FIG. 3e, a conventional wet process by a solution using an acid, an alkali, or an organic solvent can be employed as an alternative chemical process.

Although the present invention has been disclosed and described by way of only one embodiment, it is apparent to those skilled in the art that other embodiments and modifications of the present invention are possible without departing from the spirit or essential features thereof.

We claim:

1. A method for removing a resist of a semiconductor device, comprising the steps of:
   removing said resist on a layer formed on a semiconductor substrate having a functional region, in a direction of the thickness thereof by a predetermined thickness by applying plasma processing; and
   removing the remaining resist by applying a chemical process.

2. A method as set forth in claim 1, wherein said chemical process comprises a process using an electrically neutral gas which will cause a chemical removal of said resist.

3. A method as set forth in claim 1, wherein said chemical process comprises a process using a solution including an acid, an alkali or an organic solvent.

4. A method as set forth in claim 1, wherein said layer comprises a silicon dioxide insulation layer having a thickness of approximately 20 nm or less, and wherein the thickness of said remaining resist after the removal by said plasma processing is approximately 100 nm.

5. A method as set forth in claim 1, wherein said layer comprises a polysilicon conduction layer, and wherein the thickness of said remaining resist after the removal by said plasma processing is approximately 100 nm.

* * * * *